(12) United States Patent
Bae

(10) Patent No.: US 8,716,738 B2
(45) Date of Patent: May 6, 2014

(54) SEMICONDUCTOR LIGHT-EMITTING DEVICE

(75) Inventor: Jung Hyeok Bae, Gyeongsangnam-do (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/541,192

(22) Filed: Jul. 3, 2012

(65) Prior Publication Data

US 2012/0267677 A1  Oct. 25, 2012

Related U.S. Application Data

(63) Continuation of application No. 12/619,955, filed on Nov. 17, 2009, now Pat. No. 8,227,823.

(30) Foreign Application Priority Data

Nov. 18, 2008  (KR) .......................... 10-2008-0114616

(51) Int. Cl.
  *H01L 33/00*  (2010.01)
(52) U.S. Cl.
  USPC ................... 257/98; 257/81; 257/95; 257/99; 257/100

(58) Field of Classification Search
  USPC ................... 257/81, 95, 98, 99, 100
  See application file for complete search history.

(56) References Cited

U.S. PATENT DOCUMENTS

| 8,227,823 B2 * | 7/2012 | Bae ................................ 257/98 |
| 2003/0010994 A1 | 1/2003 | Chen et al. |
| 2005/0139825 A1 | 6/2005 | Song et al. |

FOREIGN PATENT DOCUMENTS

CN  1638165 A  7/2005

* cited by examiner

*Primary Examiner* — Tan N Tran
(74) *Attorney, Agent, or Firm* — Birch, Stewart, Kolasch & Birch, LLP

(57) ABSTRACT

A semiconductor light-emitting device includes a light emitting structure on a substrate. The light emitting structure includes a first conductive semiconductor layer, an active layer and a second conductive semiconductor layer. A plurality of transparent layers is disposed on the light emitting structure. A metal layer is disposed between the plurality of transparent layers. An electrode is electrically connected to the metal layer and contacts a portion of the metal layer.

14 Claims, 5 Drawing Sheets

SEMICONDUCTOR LIGHT-EMITTING DEVICE

CROSS-REFERENCE TO RELATED APPLICATIONS

This application is a Continuation of U.S. patent application Ser. No. 12/619,955, filed on Nov. 17, 2009, now U.S. Pat. No. 8,227,823 and claims priority under 35 U.S.C. 119 to Korean Patent Application No. 10-2008-0114616 (filed on Nov. 18, 2008), which is hereby incorporated by reference in its entirety.

BACKGROUND

The present disclosure relates to a semiconductor light-emitting device.

Group III-V nitride semiconductors have been regarded with much interest as a core material for light-emitting devices, such as light-emitting diodes (LEDs), laser diodes (LDs), and the like, due to excellent physical and chemical properties thereof. A III-V nitride semiconductor includes a semiconductor material having the formula $In_xAl_yGa_{1-x-y}N$ (wherein $0 \leq x \leq 1$, $0 \leq y \leq 1$, $0 \leq x+y \leq 1$).

A Light Emitting Diode (LED) is a kind of semiconductor device that converts electricity into infrared rays or other band ranges of light using the characteristics of a compound semiconductor to transmit and receive a signal, or is used as a light source.

LEDs or LDs made of these nitride semiconductor materials are extensively adopted in light emitting devices for obtaining light, and are applied as light sources for various products such as keypad light-emitting diodes of mobile phones, electrical sign boards, and lighting devices.

SUMMARY

Embodiments provide a semiconductor light-emitting device comprising a plurality of transparent electrode layers.

Embodiments provide a semiconductor light-emitting device to improve light transmission and electrical properties by disposing a metal layer between a plurality of transparent electrode layers.

An embodiment provides a semiconductor light-emitting device comprising: a substrate; a light emitting structure on the substrate, the light emitting structure comprising a first conductive semiconductor layer on the substrate, a second conductive semiconductor layer on the first conductive semiconductor layer, and an active layer between the first conductive semiconductor layer and the second conductive semiconductor layer; a transparent electrode layer on the second conductive semiconductor layer; a metal layer disposed on a top surface the transparent electrode layer and the top surface of the transparent electrode layer; a transparent layer disposed on a top surface of the metal layer and physically contacted with the top surface of the metal layer; and an electrode electrically connected to the metal layer and physically contacted with a portion of the metal layer, wherein the transparent layer has a hole and a portion of the electrode is disposed in the hole.

An embodiment provides a semiconductor light-emitting device comprising: a substrate; a light emitting structure on the substrate, the light emitting structure comprising a first conductive semiconductor layer on the substrate, a second conductive semiconductor layer on the first conductive semiconductor layer, and an active layer between the first conductive semiconductor layer and the second conductive semiconductor layer; a transparent electrode layer on the second conductive semiconductor layer; a metal layer disposed on a top surface the transparent electrode layer and the top surface of the transparent electrode layer; a transparent layer disposed on a top surface of the metal layer and physically contacted with the top surface of the metal layer; a first electrode disposed on a top surface of the first conductive semiconductor layer; and a second electrode physically contacted with top surface of the metal layer, wherein the transparent layer has a hole and a portion of the electrode is disposed in the hole, wherein the light emitting structure includes a nitride-based material, wherein the hole has a width equal to or wider than that of the top surface of the second electrode.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case wherein a layer (or film), a region, a pattern, or components is referred to as being 'on' or 'under' another substrate, layer (or film), region or patterns, the 'on' and 'under' include all the meanings of 'directly' and 'indirectly'.

Figure 1:
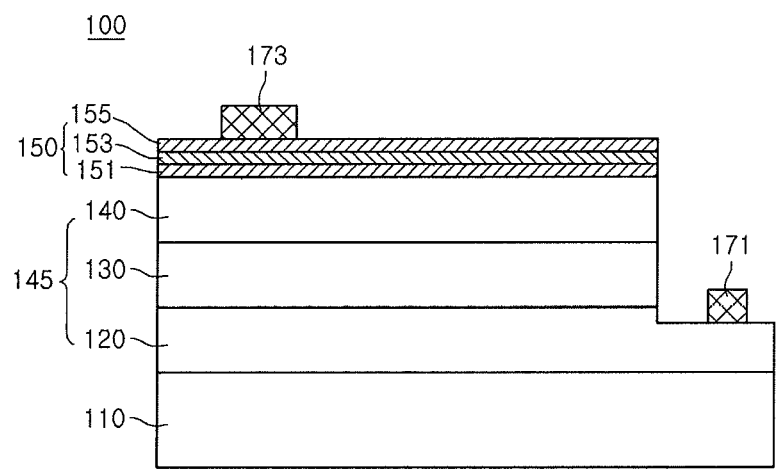
FIG. 1 is a side-sectional view of a semiconductor light-emitting device according to a first embodiment.

FIG. 1 is a side-sectional view of a semiconductor light-emitting device according to a first embodiment.

Referring to FIG. 1, a semiconductor light-emitting device 100 includes a substrate 110, a first conductive semiconductor layer 120, an active layer 130, a second conductive semiconductor layer 140, a current spreading layer 150, a first electrode 171, and a second electrode 173.

The light-emitting device 100 includes an LED using a plurality of compound semiconductor layers, for example, group III-V compound semiconductors, and the LED may be a colored LED or a UV LED which emits blue light, green light, or red light. Light emitted by the LED may be diversely implemented within the technical scope of embodiments.

The substrate 110 may be selected from the group consisting of sapphire substrate ($Al_2O_3$), GaN, SiC, ZnO, Si, GaP, InP, $Ga_2O_3$, conductive substrate, and GaAs. A concave-convex pattern may be formed on the top of the substrate 110. In addition, a layer or pattern using a compound semiconductor of group II to group VI elements, for example, at least one layer selected from the group consisting of ZnO layer (not shown), buffer layer (not shown), and undoped semiconductor layer (not shown) may be formed on the substrate 110.

The buffer layer and the undoped semiconductor layer may be formed by using a compound semiconductor of group III-V elements, the buffer layer may decrease a lattice constant difference with the substrate and the undoped semiconductor layer may be formed of an undoped GaN-based semiconductor.

A light-emitting structure 145 including a plurality of compound semiconductor layers is formed on the substrate 110. The light-emitting structure 145 includes a first conductive semiconductor layer 120, an active layer 130, and a second conductive semiconductor layer 140. The first conductive semiconductor layer 120 is formed on the substrate 110 or another semiconductor layer, the active layer 130 is formed on the first conductive semiconductor layer 120, and the second semiconductor layer 140 is formed on the active layer 130.

The first conductive semiconductor layer 120 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case wherein the first conductive semiconductor layer 120 is an N-type semiconductor, the first conductive dopant includes an N-type dopant such as Si, Ge, Sn, Se, and Te. The first conductive semiconductor layer 120 may be formed in a mono- or multi-layer, but is not limited thereto.

An active layer 130 is formed on the first conductive semiconductor layer 120, and the active layer 130 may be formed in a single quantum well structure or a multiple quantum well structure. The active layer 130 may be periodically formed by the structure of a well layer and a barrier layer, for example, an InGaN well layer/GaN barrier layer by using the compound semiconductor material of group III-V elements.

A conductive clad layer may be formed on and/or under the active layer 130, and the conductive clad layer may be formed of an AlGaN-based semiconductor.

The second conductive semiconductor layer 140 is formed on the active layer 120, and may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case wherein the second conductive semiconductor layer 140 is a P-type semiconductor, the second conductive dopant includes a P-type dopant such as Mg and Zn. The second conductive semiconductor layer 140 may be formed in a mono- or multi-layer, but is not limited thereto.

In addition, a third conductive semiconductor layer, for example, an N-type semiconductor layer or a P-type semiconductor layer may be formed on the second conductive semiconductor layer 140. The third conductive semiconductor layer is formed of a semiconductor of the different polarity from the second conductive semiconductor layer. Accordingly, the light-emitting structure 145 may include at least one selected from the group consisting of an N-P junction, a P-N junction, an N-P-N junction, and a P-N-P junction.

A current spreading layer 150 is formed on the second conductive semiconductor layer 140 or the third conductive semiconductor layer. The current spreading layer 150 includes a first transparent electrode layer 151, a metal layer 153, and a second transparent electrode layer 155.

The first transparent electrode layer 151 is formed on the second conductive semiconductor layer 140, the metal layer 153 is formed on the first transparent electrode layer 151, and the second transparent electrode layer 155 is formed on the metal layer 153.

The first transparent electrode layer 151 and the second transparent electrode layer 155 may be formed of a conductive oxide. The conductive oxide may be formed of a transparent conducting oxide (TCO) material, which includes at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), and antimony tin oxide (ATO).

The first transparent electrode layer 151 may be formed in a film form without any pattern or a predetermined pattern form, and may be formed with a predetermined thickness, for example, 200 nm or less. The first transparent electrode layer 151 may be formed in a pattern with a mesh structure for adhesion with the second conductive semiconductor layer 140.

The metal layer 153 may be formed by using a conductive metal such as Ag, Ni, and Al. When the metal layer 153 is formed in a thin film, light may be transmitted through the film, which may be formed with a predetermined thickness, for example, 10 nm or less.

Through the conductive metal, the metal layer 153 may obtain plasmon effects, which may improve light transmission efficiency of the light-emitting structure 145 at the surface. The plasmon effects may improve light transmission efficiency because nano-sized metal (eg: silver) particles are placed on the second conductive semiconductor layer 140 to operate in guiding mode (electromagnetic waveguide mode) in which light emitted from the active layer 130 is coupled on the surface of the metal layer 153 and guided. That is, light transmission efficiency may be improved due to the effect of the emitted light being guided by the charge of the metal.

The metal layer 153 may be formed in a pattern form identical to the first transparent electrode layer 151 or a form without any pattern, and may be contacted with a portion of the surface of the second conductive semiconductor layer 140 when the first transparent electrode layer 151 is formed in a mesh pattern.

The second transparent electrode layer 155 is formed on the metal layer 153, and may be formed in a predetermined pattern form or a form without any pattern.

The second transparent electrode layer 155 may be formed of a material identical to or different from the material of the first transparent electrode layer 151. Here, it is desirable in terms of light emission for the first transparent electrode layer 151 to be formed of a material identical to that of the second transparent electrode layer 155 because the two layers will have the same refractive index.

The second transparent electrode layer 155 may be formed in a pattern form identical to the first transparent electrode layer 151, and may be formed with a predetermined thickness, for example, 200 nm or less for high transmission.

A second electrode 173 is formed on the second transparent electrode layer 155, a portion of the first conductive semiconductor layer 120 is exposed, and a first electrode 171 is formed. The second electrode 173 may include a second electrode pad, and may be formed in a dot form or in a divergent multi-branched pattern.

The second electrode 173 may formed in a mono- or multi-layer by using at least one selected from the group consisting of Ag, Ag alloy, Ni, Al, Al alloy, Rh, Pd, Ir, Ru, Mg, Zn, Pt, Au, and Hf, or a selective alloy thereof. It is not limited to the metal material.

In the first embodiment, the light transmission of the current spreading layer 150: 151, 153, and 155 exceeds 90%, and the resistance value, which represents electrical properties, is less than 5Ω. Accordingly, because the resistance value of the current injected through the current spreading layer 150 into the second conductive semiconductor layer 140 is minimized in the second electrode 173, current efficiency of LED may be improved. Here, a low resistance value of the current spreading layer 150: 151, 153, and 155 results from the insertion of the metal layer 153. Here, the ITO has a specific resistance value of about $10^{-4}$ ohm·cm$^2$ because metal has a specific resistance value of about $10^{-6}$ ohm·cm$^2$.

In addition, the resistance value of the current spreading layer 150: 151, 153, and 155 may be decreased to improve the current spreading efficiency.

More than 90% of light emitted from the active layer 130 may be transmitted through the second conductive semiconductor layer 140 into the current spreading layer 150: 151, 153, and 155 to minimize the loss of light to be absorbed. Then, due to plasmon effects, the emitted light is not absorbed in the metal layer 153, but is wave guided and transmitted by the charge of the metal layer 153.

Figure 2:
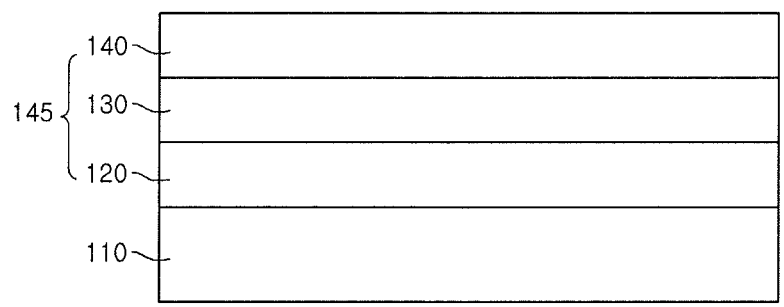
FIGS. 2 to 4 are diagrams illustrating a process of manufacturing a semiconductor light-emitting device in FIG. 1.
Figure 3:
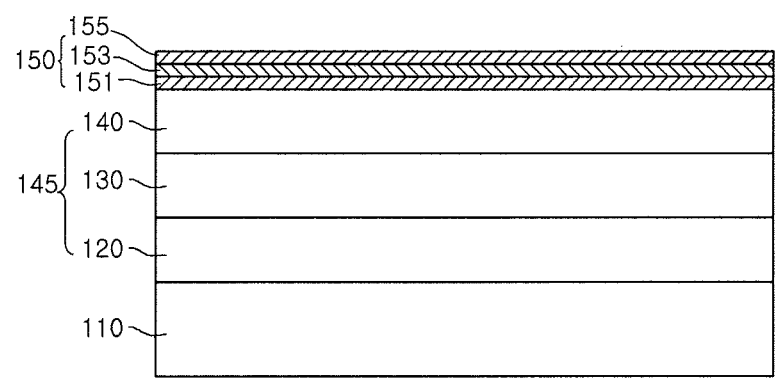
Figure 4:
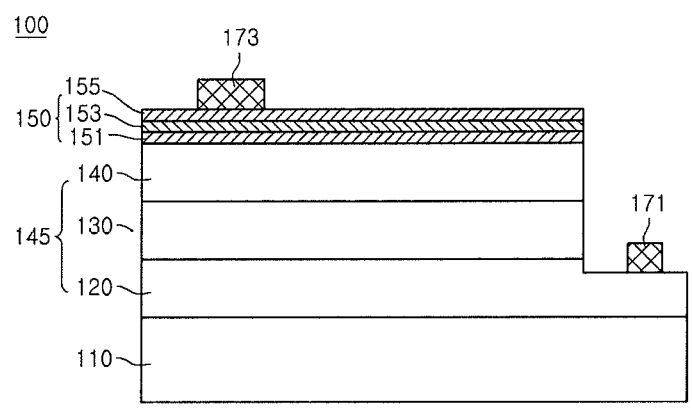

FIGS. 2 to 4 are diagrams illustrating a process of manufacturing a semiconductor light-emitting device in FIG. 1.

Referring to FIG. 2, a substrate 110 is loaded into growth equipment, and a compound semiconductor layer of group II to VI elements is formed on the substrate.

The growth equipment may include an electron beam evaporator, physical vapor deposition (PVD), chemical vapor deposition (CVD), plasma laser deposition (PLD), dual-type thermal evaporator, sputtering and metal organic chemical vapor deposition (MOCVD), but is not limited thereto.

The substrate 110 may be selected from the group consisting of sapphire substrate ($Al_2O_3$), GaN, SiC, ZnO, Si, GaP, InP, $Ga_2O_3$, conductive substrate, and GaAs. A concave-convex pattern may be formed on the top of the substrate 110. In addition, a layer or pattern using a compound semiconductor of group II to group VI elements, for example, at least one selected from the group consisting of ZnO layer (not shown), buffer layer (not shown), and undoped semiconductor layer (not shown) may be formed on the substrate 110.

The buffer layer and the undoped semiconductor layer may be formed by using a compound semiconductor of group III-V elements, the buffer layer may decrease a lattice constant difference with the substrate 110, and the undoped semiconductor layer may be formed of an undoped GaN-based semiconductor.

A light-emitting structure 145 including a plurality of compound semiconductor layers is formed on the substrate 110. The light-emitting structure 145 includes a first conductive semiconductor layer 120, and active layer 130, and a second electrode semiconductor layer 140. The first conductive semiconductor layer 120 is formed on the substrate 110 or another semiconductor layer, the active layer 130 is formed on the first conductive semiconductor layer 120, and the second conductive semiconductor layer 140 is formed on the active layer 130.

The first conductive semiconductor layer 120 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case wherein the first conductive semiconductor layer 120 is an N-type semiconductor, the first conductive dopant includes an N-type dopant such as Si, Ge, Sn, Se, and Te. The first conductive semiconductor layer 120 may be formed in a mono- or multi-layer, but is not limited thereto.

An active layer 130 is formed on the first conductive semiconductor layer 120, and the active layer 130 may be formed in a single quantum well structure or a multiple quantum well structure. The active layer 130 may be periodically formed by the structure of a well layer and a barrier layer, for example, an InGaN well layer/GaN barrier layer by using the compound semiconductor material of group III-V elements.

A conductive clad layer may be formed on and/or under the active layer 120, and the conductive clad layer may be formed of an AlGaN-based semiconductor.

The second conductive semiconductor layer 140 is formed on the active layer 130, and the second conductive semiconductor layer 140 may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case wherein the second conductive semiconductor layer 140 is a P-type semiconductor, the second conductive dopant includes a P-type dopant such as Mg and Zn. The second conductive semiconductor layer 140 may be formed in a mono- or multi-layer, but is not limited thereto.

In addition, a third conductive semiconductor layer (not shown), for example, an N-type semiconductor layer or a P-type semiconductor layer may be formed on the second conductive semiconductor layer 140. Accordingly, at least one selected from the group consisting of an N-P junction, a P-N junction, an N-P-N junction, and a P-N-P junction structure may be formed in the light-emitting structure 145.

An etching mode or a separate pattern may be formed on the top of the second conductive semiconductor layer 140 to form a roughness pattern, and the roughness may improve the external quantum efficiency.

Referring to FIG. 3, a current spreading layer 150 is formed on the second conductive semiconductor layer 140. The current spreading layer 150 includes a first transparent electrode layer 151, a metal layer 153, and a second transparent electrode layer 153.

The first transparent electrode layer 151 is formed on the second conductive semiconductor layer 140, the metal layer 153 is formed on the first transparent electrode layer 151, and the second transparent electrode layer 155 is formed on the metal layer 153.

The first transparent electrode layer 151, the metal layer 153, and the second transparent electrode layer 155 may be formed by evaporation method and/or sputtering method, but is not limited thereto.

The first transparent electrode layer 151 and the second transparent electrode layer 155 may be formed of a conductive oxide (TCO) material, which may include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), and antimony tin oxide (ATO). The first transparent electrode layer 151 and the second transparent electrode layer 155 may be formed of the same material or materials that have identical or similar refractive indices, but are not limited thereto.

The first transparent electrode layer 151 and the second transparent electrode layer may be formed in a layer or a plurality of patterns. The first transparent electrode layer 151 and the second transparent electrode layer 155 may be formed in a pattern different from or identical to each other. For example, the first transparent electrode layer 151 may be formed in a mesh pattern, the second transparent electrode layer 155 may be formed patternless, and vice versa.

The first transparent electrode layer 151 and the second transparent electrode layer 155 may be formed with a thickness of 200 nm or less, and may be formed of the same thickness or different thicknesses.

The metal layer 153 is formed between the first transparent electrode layer 151 and the second transparent electrode layer 155, and may be formed by using a conductive metal such as Ag, Ni, and Al.

In order to obtain plasmon effects, the metal layer 153 is formed with a predetermined thickness, for example, 10 nm or less, and may be disposed on the surface of the light-emitting structure 145 to improve the light-emitting efficiency. The plasmon effects may improve the transmission efficiency of light because, for example, nano-sized metal (e.g. silver) particles are placed on the second conductive semiconductor layer 140 to lead to generation of the guiding mode (electromagnetic waveguide mode) in which light emitted from the active layer 130 is coupled on the surface of the metal layer 153 and guided. That is, light transmission efficiency may be improved due to the effects in which the emitted light is guided by the charge of the metal.

The metal layer 153 may be formed in a pattern form identical to that of the first transparent electrode layer 151 or a form without any pattern, and may be contacted with a portion of the surface of the second conductive semiconductor layer 140 when the first transparent electrode layer 151 is formed in a mesh pattern.

The current spreading layer 150 includes a transmissive oxide film including a metal layer 153 with a thickness of a few nanometer or less, which provides a low resistance value and a high light transmission.

Referring to FIG. 4, a portion of the conductive semiconductor layer 120 is exposed through mesa etching. The mesa etching method may include a dry etching and/or a wet etching method, but is not limited thereto.

A first electrode 171 is formed on the first conductive semiconductor layer 120. Here, the position of the first electrode layer 171 may be modified, but is not limited thereto.

A second electrode layer 173 is formed on a second transparent electrode layer 155 of the current spreading layer 150. The second electrode 173 may be formed dotted, or in a multi-fingered or branched pattern with a divergent structure, but is not limited thereto. The second electrode 173 may include a second electrode pad (not shown) or may form a second electrode pad separately.

The second electrode 173 may be formed in a mono- or multi-layer of at least one selected from the group consisting of Ag, Ag, alloy, Ni, Al, Al alloy, Rh, Pd, Ir, Ru, Mg, Zn, Pt, Au, and Hf, or a selective alloy thereof. It is not limited to the metal materials.

When a forward current is applied to the second electrode 173, the current is transmitted through the current spreading layer 150. Then, the current is diffused by low resistance properties of the current spreading layer 150 and uniformly supplied to the second conductive semiconductor layer 140.

A portion of light emitted from the active layer 130 is transmitted through the second conductive semiconductor layer 140 into the current spreading layer. Then, the light transmission of the current spreading layer 150 exceeds 90%.

Accordingly, a semiconductor light-emitting device 100 may inject current with a uniform distribution, and may also improve the external quantum efficiency of light transmitting through the second conductive semiconductor layer 140.

Figure 5:
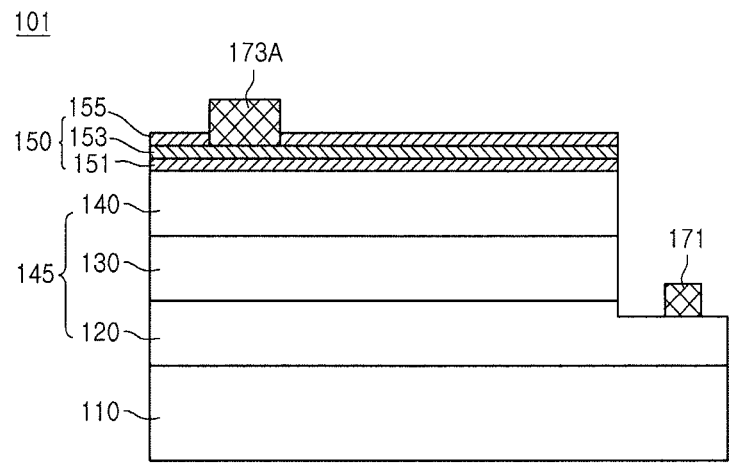
FIG. 5 is a side-sectional view of a semiconductor light-emitting device according to a second embodiment.

FIG. 5 is a side-sectional view of a semiconductor light-emitting device according to a second embodiment. In the description of the second embodiment, the like reference numerals will be used for identical elements of the first embodiment, and repeated description thereof will be omitted.

Referring to FIG. 5, a semiconductor light-emitting device 101 includes a substrate 110, a first conductive semiconductor layer 120, an active layer 130, a second conductive semiconductor layer 140, a current spreading layer 150, a first electrode 171, and a second electrode 173A.

The second electrode 173A may function as an electrode pad, and may be formed on a metal layer 153 of the current spreading layer 150. The second electrode 173A may be directly contacted with a second transparent electrode layer 155 and/or the metal layer 153 of the current spreading layer 150 to improve the current spreading.

Figure 6:
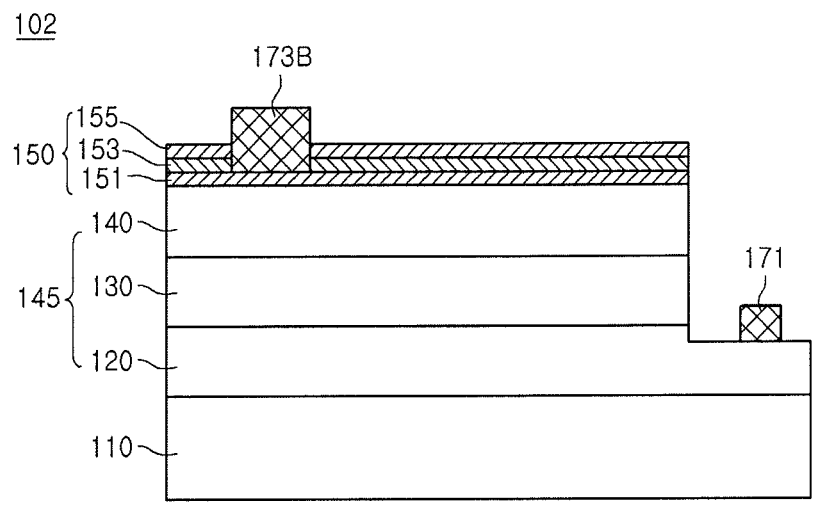
FIG. 6 is a side-sectional view of a semiconductor light-emitting device according to a third embodiment.

FIG. 6 is a side cross-sectional view of a semiconductor light-emitting device according to a third embodiment. In description of the third embodiment, the like reference numerals will be used for identical elements of the first embodiment, and repeated description thereof will be omitted.

Referring to FIG. 6, a semiconductor light-emitting device includes a substrate 110, a first conductive semiconductor layer 120, an active layer 130, a second conductive semiconductor layer 140, a current spreading layer 150, a first electrode 171, and a second electrode 173B.

The second electrode 173B may function as an electrode pad, and may be formed on a first transparent electrode layer 153 of the current spreading layer 150. The second electrode 173B may be directly contacted with a second transparent electrode layer 155 of the current spreading layer 150, the metal layer 153, and the first transparent electrode layer 151 to improve the current spreading. Here, in the first and second transparent electrode layers 151 and 155, current may be diffused by a mesh pattern structure in layers different from each other.

Figure 7:
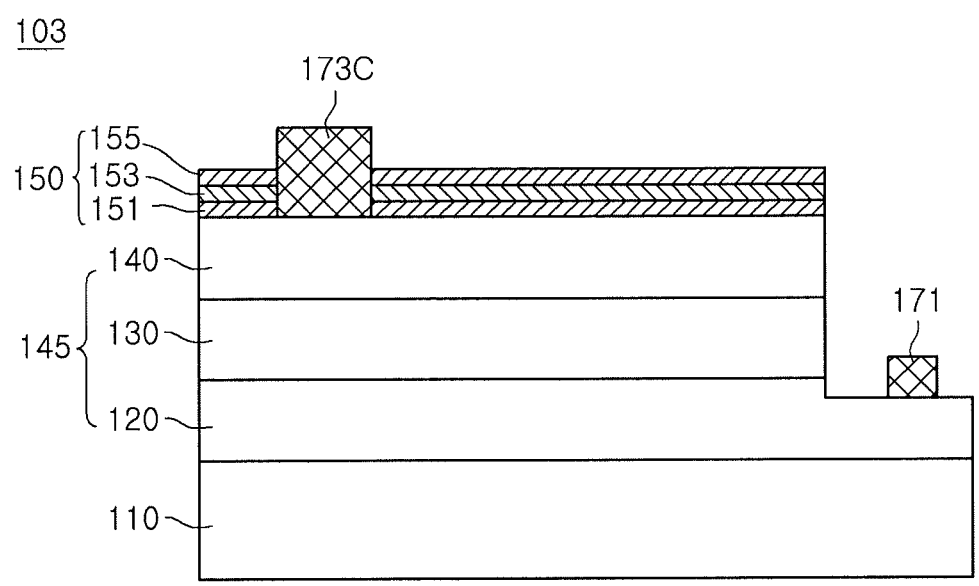
FIG. 7 is a side-sectional view of a semiconductor light-emitting device according to a fourth embodiment.

FIG. 7 is a side-sectional view of a semiconductor light-emitting device according to a fourth embodiment. In description of the fourth embodiment, the like reference numerals will be used for identical elements of the first embodiment, and repeated description thereof will be omitted.

Referring to FIG. 7, a semiconductor light-emitting device 103 includes a substrate 110, a first conductive semiconductor layer 120, an active layer 130, a second conductive semiconductor layer 140, a current spreading layer 150, a first electrode 171, and a second electrode 173C.

The second electrode 173C may function as an electrode pad, and may be formed on the second conductive semiconductor layer 140 to be protruded or exposed as a via structure to the current spreading layer 150. The second electrode 173C may be directly contacted with a second transparent electrode layer 155 of the current spreading layer 150, the metal layer 153, the first transparent electrode layer 151, and the second conductive semiconductor layer 140 to improve the current spreading. Here, in the first and second transparent electrode layers 151 and 155, current may be diffused by a mesh pattern structure in layers different from each other.

Figure 8:
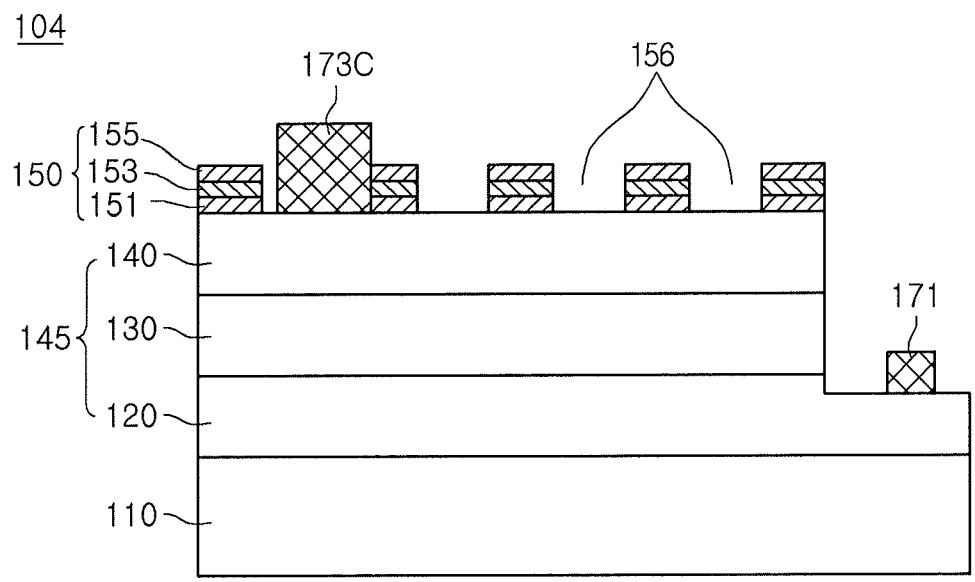
FIG. 8 is a side-sectional view of a semiconductor light-emitting device according to a fifth embodiment.

FIG. 8 is a side-sectional view of a semiconductor light-emitting device according to a fifth embodiment. In the description of the fifth embodiment, the like reference numerals will be used for identical elements of the first embodiment, and repeated description thereof will be omitted.

Referring to FIG. 8, a semiconductor light-emitting device 104 includes a current spreading layer 150 is formed in a mesh pattern. The current spreading layer 150 includes the first transparent electrode layer 151, the metal layer 153, and the second transparent electrode layer 155. The first transparent electrode layer 151, the metal layer 153, and the second transparent electrode layer 155 are formed in a mesh pattern having a hole 156.

Figure 9:
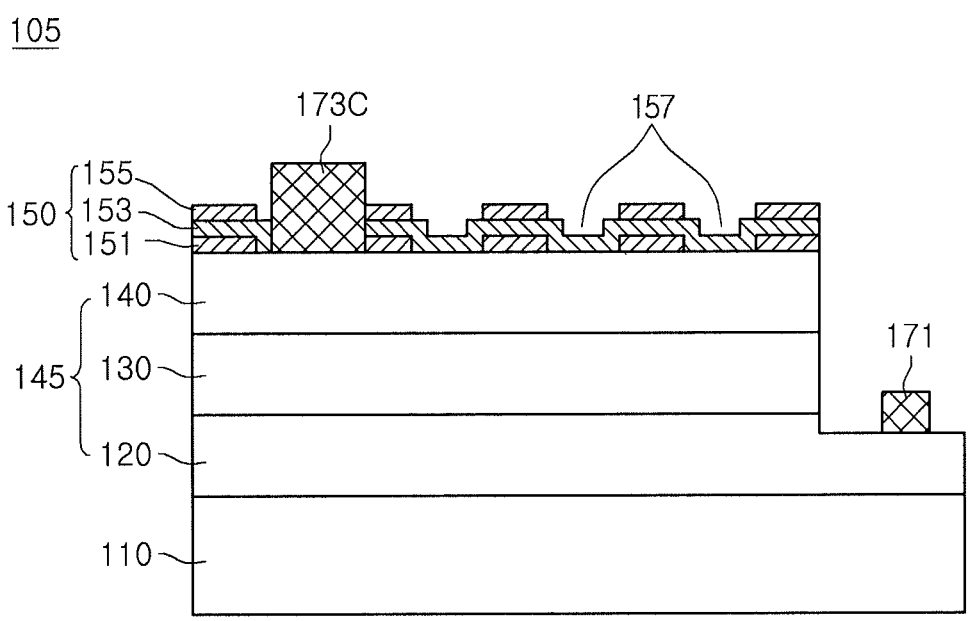
FIG. 9 is a side-sectional view of a semiconductor light-emitting device according to a sixth embodiment.

FIG. 9 is a side-sectional view of a semiconductor light-emitting device according to a sixth embodiment. In the description of the sixth embodiment, the like reference numerals will be used for identical elements of the first embodiment, and repeated description thereof will be omitted.

Referring to FIG. 9, a semiconductor light-emitting device 105 includes a current spreading layer 150 includes the first transparent electrode layer 151 and the second transparent electrode layer 155 in a mesh pattern having a hole 157. A part of the metal layer 153 is formed on the second conductive semiconductor layer 140 and is directly connected to the second conductive semiconductor 140.

Figure 10:
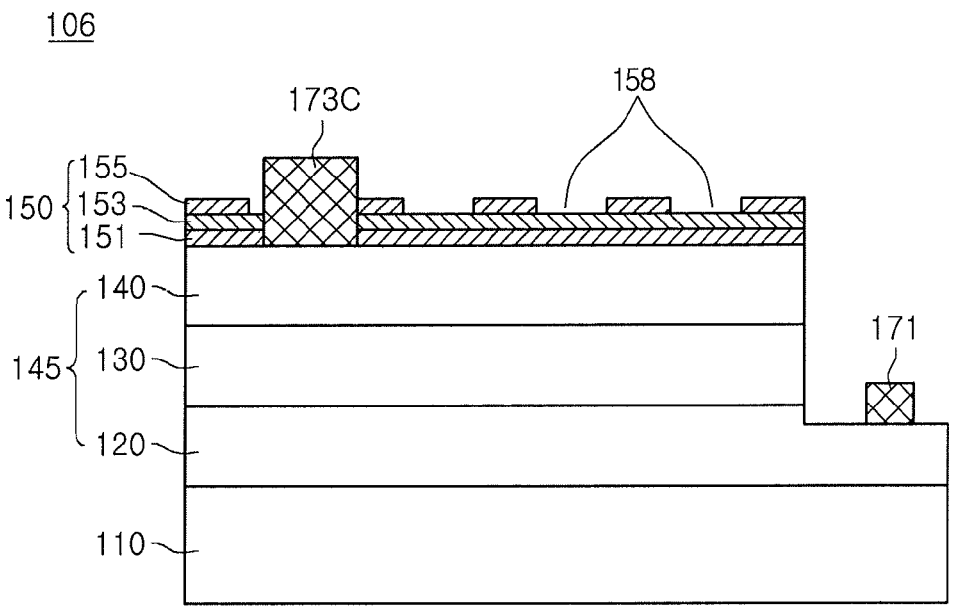
FIG. 10 is a side-sectional view of a semiconductor light-emitting device according to a seventh embodiment.

FIG. 10 is a side-sectional view of a semiconductor light-emitting device according to a seventh embodiment. In the description of the seventh embodiment, the like reference numerals will be used for identical elements of the first embodiment, and repeated description thereof will be omitted.

Referring to FIG. 10, a semiconductor light-emitting device 106 includes a current spreading layer 150 includes the second transparent electrode layer 155 in a mesh pattern having a hole 158.

Figure 11:
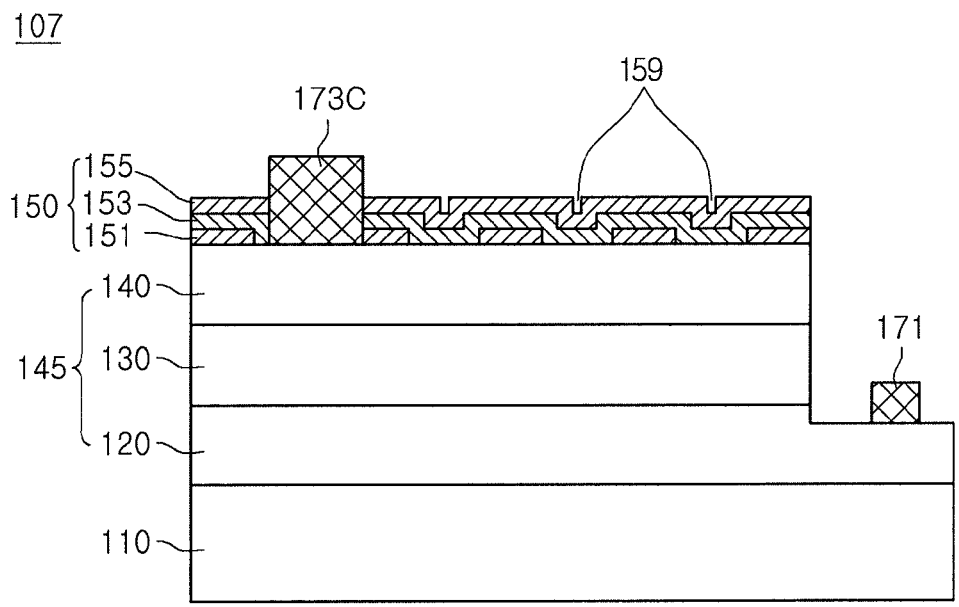
FIG. 11 is a side-sectional view of a semiconductor light-emitting device according to a ninth embodiment.

FIG. 11 is a side-sectional view of a semiconductor light-emitting device according to a eighth embodiment. In the description of the eighth embodiment, the like reference numerals will be used for identical elements of the first embodiment, and repeated description thereof will be omitted.

Referring to FIG. 11, a semiconductor light-emitting device 107 includes a current spreading layer 150 includes the first transparent electrode layer 155 in a mesh pattern having a hole 159.

The metal layer 153 is connected to the second conductive semiconductor layer 140 and the first transparent electrode layer 151.

An embodiment provides a method for manufacturing a semiconductor light-emitting device that comprises forming a light-emitting structure comprising a first conductive semiconductor layer, an active layer, and a second conductive semiconductor layer; forming a first transparent electrode layer on the light-emitting structure; forming a metal layer on the first transparent electrode layer; forming a second transparent electrode layer on the metal layer; and forming a second electrode layer on the second transparent electrode layer.

Embodiments can improve light transmission on the surface of a light-emitting structure.

Embodiments can improve electrical properties due to a transparent electrode layer including a metal layer.

Embodiments can decrease the resistance value on the surface of a light-emitting structure.

Embodiments can improve light efficiency of the semiconductor light-emitting device.

Embodiments can improve the reliability of the semiconductor light-emitting device.

Embodiments can provide a semiconductor light-emitting device like LED.

Embodiments can improve the electrical reliability of the semiconductor light-emitting device.

Embodiments can improve the current efficiency and light efficiency of the semiconductor light-emitting device.

Embodiments can apply a light source including a packaged semiconductor light-emitting device to an illumination field, an indication field, and a display field.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light-emitting device, comprising:
a substrate;
a light emitting structure on the substrate, the light emitting structure comprising a first conductive semiconductor layer on the substrate, a second conductive semiconductor layer on the first conductive semiconductor layer, and an active layer between the first conductive semiconductor layer and the second conductive semiconductor layer;
a transparent electrode layer on the second conductive semiconductor layer;
a metal layer disposed on a top surface of the transparent electrode layer;
a transparent layer disposed on a top surface of the metal layer and physically contacted with the top surface of the metal layer; and
an electrode electrically connected to the metal layer and physically contacted with a portion of the metal layer,
wherein the transparent layer has a hole and a portion of the electrode is disposed in the hole,
wherein the transparent layer has a material different from the transparent electrode layer,
wherein the transparent layer has a thickness different from a thickness of the metal layer and the transparent electrode layer, and
wherein a thickness of the transparent electrode layer is different from a thickness of the metal layer.

2. The semiconductor light-emitting device according to claim 1, wherein the metal layer includes a different material from the electrode and has a hole corresponding to the electrode.

3. The semiconductor light-emitting device according to claim 1, wherein the transparent electrode layer comprises a transparent conducting oxide (TCO) material.

4. The semiconductor light-emitting device according to claim 3, wherein the electrode comprises a multi-branched pattern.

5. The semiconductor light-emitting device according to claim 4, wherein the electrode comprises a pad.

6. The semiconductor light-emitting device according to claim 1, wherein the electrode directly contacted with an upper surface of the metal layer.

7. The semiconductor light-emitting device according to claim 1, wherein the transparent electrode layer comprises a thickness of 200 nm or less.

8. The semiconductor light-emitting device according to claim 7, wherein the transparent layer comprises a thickness of 200 nm or less.

9. The semiconductor light-emitting device according to claim 1, wherein the transparent layer comprises a metal oxide.

10. A semiconductor light-emitting device, comprising:
a substrate;
a light emitting structure on the substrate, the light emitting structure comprising a first conductive semiconductor layer on the substrate, a second conductive semiconductor layer on the first conductive semiconductor layer, and an active layer between the first conductive semiconductor layer and the second conductive semiconductor layer;
a transparent electrode layer on the second conductive semiconductor layer;
a metal layer disposed on a top surface of the transparent electrode layer;
a transparent layer disposed on a top surface of the metal layer and physically contacted with the top surface of the metal layer; and
a first electrode disposed on a top surface of the first conductive semiconductor layer; and
a second electrode physically contacted with top surface of the metal layer,
wherein the transparent layer has a hole and a portion of the electrode is disposed in the hole,
wherein the light emitting structure includes a nitride-based material,
wherein the hole has a width equal to or wider than that of the top surface of the second electrode,
wherein the transparent layer has a metal oxide material different from the transparent electrode layer, and
wherein the transparent electrode layer has a thickness different from the metal layer and the transparent layer has a thickness different from the metal layer and the transparent electrode layer.

11. The semiconductor light-emitting device according to claim 1, wherein a lower portion of the second electrode is embedded in the transparent layer.

12. The semiconductor light-emitting device according to claim 11, wherein the metal layer includes a different material from the second electrode and the transparent electrode layer comprises a transparent conducting oxide (TCO) material.

13. The semiconductor light-emitting device according to claim 12, wherein the metal layer is disposed between the transparent electrode layer and the transparent layer.

14. The semiconductor light-emitting device according to claim 13, wherein the transparent electrode layer and the transparent layer comprise a thickness of 200 nm or less.

* * * * *